United States Patent
Lee et al.

(10) Patent No.: US 8,144,086 B2
(45) Date of Patent: Mar. 27, 2012

(54) ORGANIC LIGHT EMITTING DISPLAY DEVICE

(75) Inventors: Hun-Jung Lee, Suwon-si (KR); Ki-Nyeng Kang, Suwon-si (KR); Yeon-Gon Mo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 668 days.

(21) Appl. No.: 12/318,409

(22) Filed: Dec. 29, 2008

(65) Prior Publication Data
US 2009/0284449 A1    Nov. 19, 2009

(30) Foreign Application Priority Data
May 19, 2008    (KR) .......................... 10-2008-0045969

(51) Int. Cl.
*G09G 3/32* (2006.01)
(52) U.S. Cl. ............................................ 345/82; 345/76
(58) Field of Classification Search .................... 345/82, 345/83, 76, 694, 695; 313/483, 581; 315/169.3, 315/169.4
See application file for complete search history.

(56) References Cited

U.S. PATENT DOCUMENTS
| | | | | |
|---|---|---|---|---|
| 6,861,810 B2* | 3/2005 | Rutherford | ................ | 315/169.3 |
| 7,528,545 B2* | 5/2009 | Liao et al. | ................ | 313/506 |
| 7,977,868 B2* | 7/2011 | Shieh et al. | ................ | 313/504 |
| 2006/0152531 A1* | 7/2006 | Lin et al. | ................ | 345/613 |

FOREIGN PATENT DOCUMENTS
| | | |
|---|---|---|
| KR | 10-2006-0069102 | 6/2006 |
| KR | 10-2006-0086007 | 7/2006 |
| KR | 10-2006-0104709 | 10/2006 |
| KR | 1020070067826 A | 6/2007 |
| KR | 1020070091681 A | 11/2007 |

OTHER PUBLICATIONS

Korean Office Action dated Sep. 29, 2009 corresponding to Korean Priority application No. 10-2008-0045969.

* cited by examiner

*Primary Examiner* — Ricardo L Osorio
(74) *Attorney, Agent, or Firm* — Robert E. Bushnell, Esq.

(57) ABSTRACT

An organic light emitting display device having a pixel unit including a plurality of scan lines, data lines and pixel power lines arranged in a matrix type and forming respective sub pixels in an intersection region of the plurality of scan lines, data lines and pixel power lines; a thin film transistor including a pad unit receiving signals to drive driving the respective sub pixels, a scan driver and a data driver supplying the signals to the plurality of scan lines and data lines through the pad unit, and non-pixel unit formed with a power supply line supplying power to the pixel powers line, the sub-pixel including an oxide semiconductor layer; a capacitor having a lower electrode and an upper electrode formed of a transparent conductive material; and an organic light emitting element electrically coupled to the thin transistor and disposed on the capacitor.

14 Claims, 4 Drawing Sheets

US 8,144,086 B2

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on May 19, 2008 and there duly assigned Serial No. 10-2008-0045969.

BACKGROUND OF THE INVENTION

1. Field of the Invention

The present invention relates to an organic light emitting display device.

2. Discussion of Related Art

Recently, a thin film transistor (TFT) has been widely used as a switching device to operate respective sub pixels in a display device such as an organic light emitting display (OLED), a liquid crystal display (LCD), etc. Therefore, it has been much interested in manufacturing a thin film transistor, and the more efficient thin film transistor and manufacturing methods thereof have been devised.

Generally, a semiconductor layer of a thin film transistor applied to an organic light emitting display device is formed of an amorphous silicon (a-Si) layer or a poly silicon (Poly-Si) layer.

Meanwhile, in order to implement the organic light emitting display device as a transparent display, a technique forming a semiconductor layer of a thin film transistor with a transparent oxide semiconductor layer has been spotlighted. Also, all of electrodes and wires used in the organic light emitting display device have been formed of a transparent conductive material.

However, when forming all the electrodes and wires used in the organic light emitting display device with a transparent conductive material, voltage drop (IR Drop) occurs due to the transparent wires, etc., thereby causing a problem that image quality of the organic light emitting display device is deteriorated.

In other words, the transparent conductive material has higher resistance as compared to a general opaque metal material thus generating a generate voltage drop, thereby causing a disadvantage that the overall brightness of the organic light emitting display device becomes uneven by means of a voltage difference due to the voltage drop.

SUMMARY OF THE INVENTION

Therefore, the present invention proposes to solve the above problems. It is an object of the present invention to provide an organic light emitting display device forming a transparent organic light emitting display device where voltage drop is prevented.

An object of the present invention is not limited to the object described above, however, another object of the present invention may be clearly understood by those skilled in the art from the following description.

To achieve the above object, according to one embodiment of the present invention, there is provided an organic light emitting display device including: a pixel unit including a plurality of scan lines, data lines and pixel power lines arranged in a matrix type and forming respective sub pixels in an intersection region of the plurality of scan lines, data lines and pixel power lines; a thin film transistor including a pad unit receiving signals to drive the respective sub pixels, a scan driver and a data driver supplying the signals to the plurality of scan lines and data lines through the pad unit, and non-pixel unit formed with a power supply line supplying power to the pixel powers line, the sub-pixel including an oxide semiconductor layer; a capacitor disposed spaced from the thin film transistor and having a lower electrode and an upper electrode formed of a transparent conductive material; and an organic light emitting element electrically coupled to the thin transistor and disposed on the capacitor.

At this time, the scan lines, the data lines, the pixel power lines, and the power supply line are formed of an opaque metal material, or the scan lines, the data lines, gate electrode and source/drain electrodes of the thin film transistor, and the pixel power line are formed of a transparent conductive material, and the power supply line is formed of an opaque metal material.

Also, the opaque metal material is one of the group consisting of aluminum (Al), silver (Ag), molybdenum (Mo), chrome (Cr), nickel (Ni), gold (Au), titanium (Ti), and tantalum (Ta). The transparent conductive material is at least one selected from the group consisting of indium tin oxide (ITO), indium zinc oxide (IZO), indium zinc tin oxide (IZTO), indium cesium oxide (ICO), an indium tungsten oxide (IWO), and a semitransparent metal composition.

Also, the oxide semiconductor layer has zinc oxide (ZnO) as a main element, and the oxide semiconductor layer is doped with at least one ion of indium (In), gallium (Ga), and stannum (Sn).

As described above, with the present invention, the lower electrode and upper electrode of the capacitor provided in the respective sub pixels are formed of a transparent conductive material, making it possible to the organic light emitting display device as a transparent display device. Also, in order to prevent voltage drop of the organic light emitting display device, the power supply line disposed on at least the non-display region is formed of an opaque metal material, making it possible to provide the organic light emitting display device having uniform brightness.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
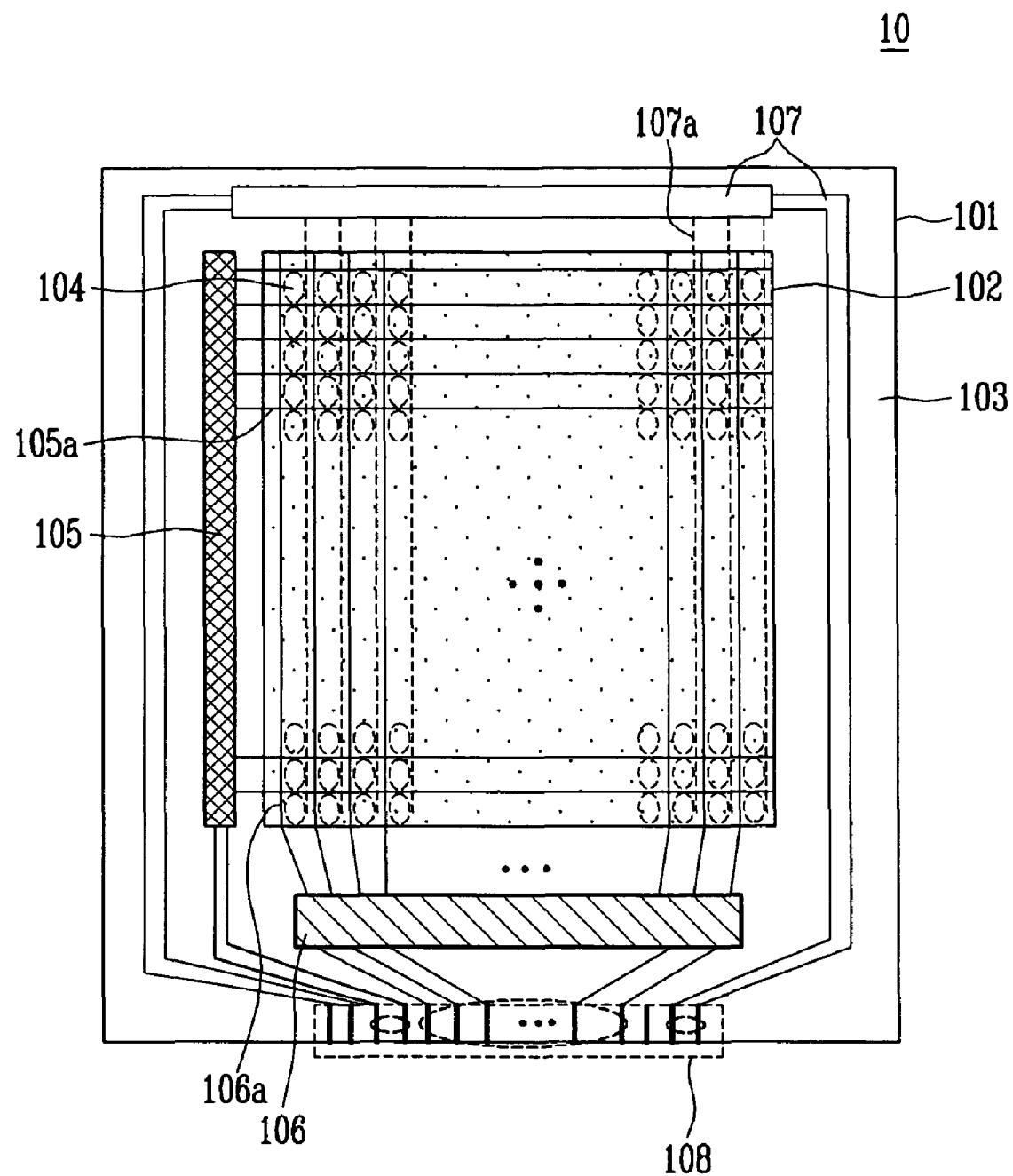
FIG. 1 is a schematic plan view of an organic light emitting display device according to one embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, the exemplary embodiments according to the present invention will be described in more detail with reference to the accompanying drawings.

FIG. 1 is a schematic plan view of an organic light emitting display device according to one embodiment of the present invention.

Referring to FIG. 1, a substrate 101 is defined as a pixel unit 102 displaying an image and a non-pixel unit 103 not displaying an image, which is an external region of the pixel unit 102.

At this time, in the pixel unit 102, a plurality of scan lines 105a, data lines 106a, and pixel power lines 107a are arranged in a matrix type, and respective sub pixels 104 are formed in an intersection region of the respective scan lines 105a, data lines 106a, and pixel power lines 107. In other words, the pixel unit 102 displaying an image is implemented through the plurality of sub pixels 104. Herein, the sub pixel 104 includes at least two thin film transistors, a capacitor connected to the thin transistors, and an organic light emitting element.

Also, in the non-pixel unit 103, a pad unit 108 transferring signals in order to drive an organic light emitting element provided in the respective sub pixels 104 and a power supply line 107 are formed, and a scan driver 105 and a data driver 106 supplying signals provided from the external through the pad unit to the plurality of scan lines 105a and data lines 106a are arranged.

At this time, the power supply line 107 are electrically coupled to the respective pixel power lines 107a arranged within the pixel unit 102 to function to supply power to the respective pixel power lines 107a.

Figure 2:
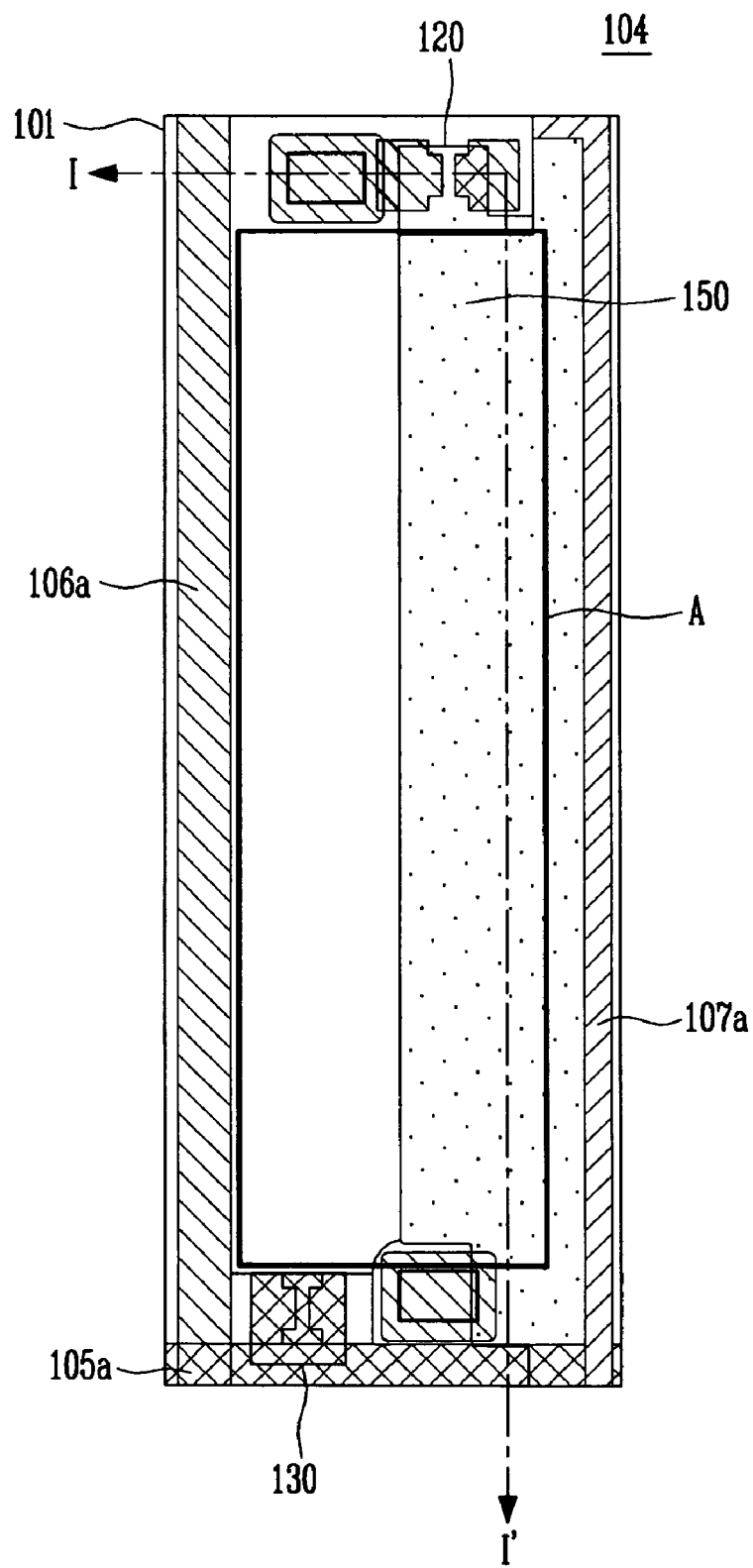
FIG. 2 is a schematic plan view showing a structure of the sub pixel of FIG. 1.
Figure 3:
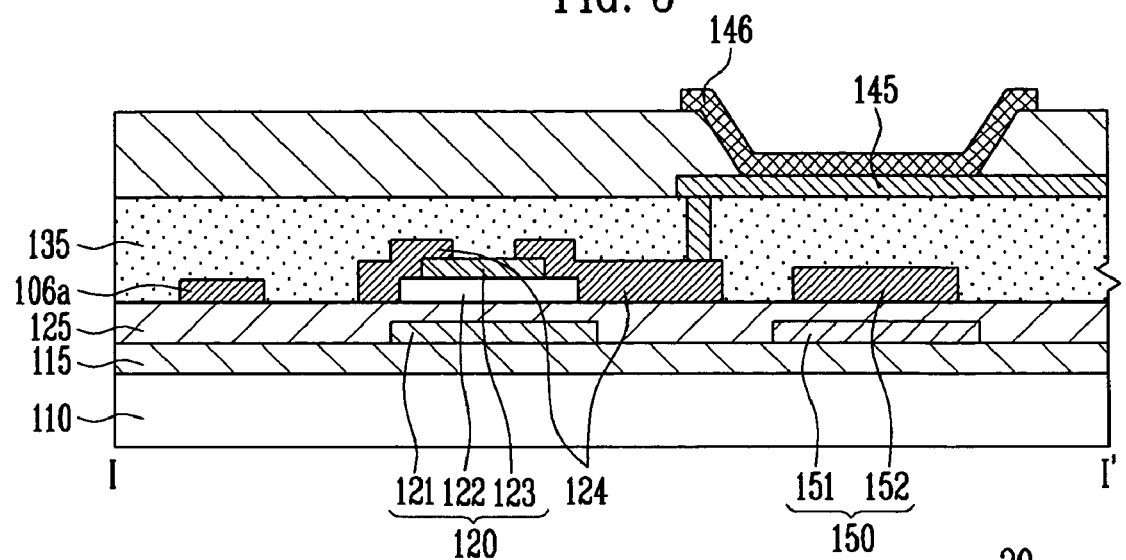
FIG. 3 is a cross-sectional view of a specific portion (I-I') of FIG. 2.

FIG. 2 is a schematic plan view showing a structure of the sub pixel of FIG. 1, and FIG. 3 is a cross-sectional view of a specific portion (I-I') of FIG. 2.

First, referring to FIG. 2, the sub pixel 104 includes a scan line 105a, a data line 106a and a pixel power line 107a, first and second thin film transistors 120, 130, a capacitor 150, and an organic light emitting element (not shown) formed on a substrate 101.

The sub pixel 104 is selected to receive data signals from the data line 106a when scan signals are supplied to the scan line 105a and emits light at a brightness corresponding to current supplied to the organic light emitting element from the pixel power line 107a.

In the related art, the lower electrode and upper electrode of the capacitor 150 are formed of an opaque electrode material. However, in the present embodiment, the lower electrode and upper electrode of the capacitor 150 are formed of a transparent electrode material to improve transmittance of the sub pixel 104, so that region A of the sub pixel 04 is formed as a transparent region.

In other words, in the present embodiment, the lower electrode and upper electrode of the capacitor 150 are formed of a transparent electrode material to expand an opening region of light emitted from the organic light emitting element so that the opening ratio of the organic light emitting display device is improved.

Also, the lower electrode and upper electrode of the capacitor 150 are formed of transparent electrode material so that the organic light emitting display device 10 is implemented as a transparent display device. The word "transparent" in the present invention means a transmittance of over 70%.

Also, the gate electrode and source/drain electrodes of the thin film transistors 120 and 130, the scan line 105a, the data line 106a, and the pixel power line 107a are formed of an opaque metal material having low resistance in order to prevent voltage drop Ir Drop.

In the conventional transparent organic light emitting display device, all of the electrodes and wires arranged on the substrate are formed of a transparent electrode material. In this case, however, the transparent electrode material has a higher resistance over 10 times as compared to the opaque electrode material to have a disadvantage that brightness is not uniform due to the voltage drop at driving.

Therefore, in order to overcome such a disadvantage, in the present embodiment in order to implement the organic light emitting display device, the capacitor occupying most of the sub pixel 104 is formed of a transparent conductive material and regions other than the capacitor are formed of an opaque electrode material to implement a transparent display device whose voltage drop is reduced.

Referring to FIG. 3, an organic light emitting display device 10 according to the present invention, having a bottom gate structure or an inverted staggered structure, includes a first thin film transistor 120 disposed on a substrate 101, a capacitor 150 disposed spaced from the first thin film transistor, and an organic light emitting element electrically coupled to the first thin film transistor 120 and disposed on an upper of the capacitor 150.

The substrate 101 may be made of material having an insulating property such as glass, plastic, silicon or synthetic resin, and, by way of example, preferably provided as a transparent substrate such as a glass substrate.

A buffer layer 115 is disposed on the substrate 101, and the first thin film transistor 120 is disposed on the buffer layer 115.

The first thin film transistor 120 includes a gate electrode 121, an oxide semiconductor layer 122, and source/drain electrodes 124. The gate electrode 121 is disposed on the buffer layer 115, wherein it may be formed of an opaque metal material having low resistance, for example, one of the group consisting of aluminum (Al), silver (Ag), molybdenum (Mo), chrome (Cr), nickel (Ni), gold (Au), titanium (Ti), and tantalum (Ta). Also, although not shown in the drawing, a scan line 105a formed of the same material as the gate electrode 121 is disposed on the buffer layer 115. A lower electrode 151 of the capacitor 150 is disposed on the buffer layer 115, spaced from the gate electrode 121.

Also, the lower electrode 151 constitutes the capacitor, together with an upper electrode 152. The lower electrode 151 and the upper electrode 152 are formed of a transparent conductive oxide (TCO)-based transparent conductive material to form the transparent capacitor 150. The TCO-based transparent conductive material may be formed of one selected from the group consisting of indium tin oxide (ITO), indium zinc oxide (IZO), indium zinc tin oxide (IZTO), indium cesium oxide (ICO), an indium tungsten oxide (IWO), and semitransparent metal.

In other words, in the present embodiment, the capacitor 150 is transparently formed to improve transmittance of the organic light emitting display device and opening ratio of a light-emitting region where light is emitted from an organic thin film layer 146. Also, the lower electrode 151 and upper electrode 152 of the capacitor 150 are formed of transparent conductive material, making it possible to light-emit a rear surface or both surfaces of the organic light emitting display device 10.

Therefore, in the related art, the capacitor is formed of an opaque metal electrode so that light emitted from the organic thin film layer 146 is blocked by the capacitor 150. In the present embodiment, however, the upper electrode 152 and lower electrode 151 of the capacitor 150 are formed of a transparent conductive material so that light emitted from the organic thin film layer 146 transmits the capacitor 150, making it possible to emit light even to the rear surface of the substrate 101.

A gate insulating layer 125 is formed on the buffer layer 115 arranged with the gate electrode 121 and the lower electrode 151. The gate insulating layer 125 insulates the gate electrode 121 and the lower electrode 151 from the semiconductor layer 122. Such a gate insulating layer 125 is formed of an oxide film, a nitride film, a transparent insulating material, or the like but not limited thereto.

The semiconductor layer 122 is formed on the gate insulating layer 125, in a predetermined pattern. The semiconductor layer 122 may be formed of a semiconductor material having zinc oxide (ZnO) as a main element, or zinc oxide (ZnO) is doped with ion such as indium (In), gallium (Ga) and stannum (Sn), etc., for example, InZnO(IZO) GaInZnO (GIZO), etc. Like this, the semiconductor layer 122 is formed of an oxide semiconductor having zinc oxide (ZnO) as a principal component to have transparency. Also, the semiconductor layer 122 is better in mobility and uniformity as compared to amorphous silicon and poly silicon, making it possible to provide a thin film transistor having more improved reliability. Also, if the semiconductor layer 122 is formed as an oxide semiconductor layer, it can be manufactured through existing low temperature poly silicon (LTPS), being possible to perform the process at a low temperature of below 300° C.

An etch stopper 123 is disposed on the semiconductor layer 122 to prevent damage due to exposure of the semiconductor layer 122 in the subsequent process.

The source/drain electrodes 124 are disposed on the gate insulating layer 125, the semiconductor layer 122 and an etch stopper 123, and are formed both sides of the semiconductor layer 122. The source/drain electrodes 124 are formed of opaque metal material having low resistance such as the gate electrode 121. Also, a data line 106 formed of the same material as the source/drain electrodes 124 is disposed on the gate insulating layer 125. In the present invention, the data line 106a is disposed spaced from the source electrode.

Also, the upper electrode 152 of the capacitor 150 is disposed on the gate insulating layer 125 and is formed on a position corresponding to the lower electrode 151. The upper electrode 152 may be formed of the same material as the lower electrode 151.

A planarization layer 135 is formed over the gate insulating layer 125 arranged with the source/drain electrode 124, the upper electrode 152 and the data line 106a. Also, a via hole is formed on the planarization layer 135 to electrically couple the drain electrode with an anode electrode 145 of the organic light emitting element.

The anode electrode 145 is electrically connected to the drain electrode of the thin film transistor 120, and is disposed on the planarization layer 135. Also, the organic thin film layer 146 and the cathode electrode are arranged on the anode electrode 145 to form the organic light emitting element.

Figure 4:
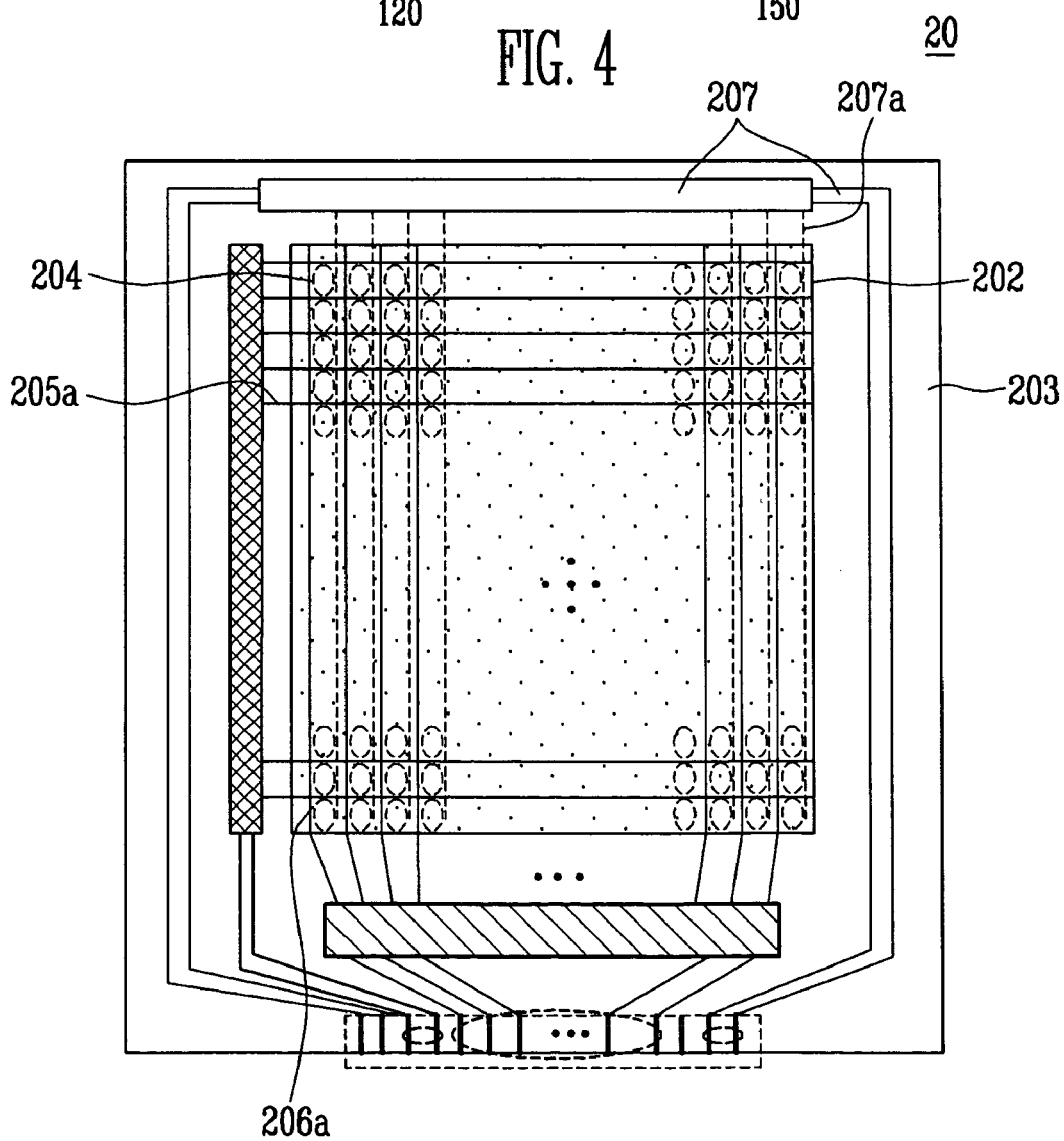
FIG. 4 is a schematic plan view of an organic light emitting display device according to another embodiment of the present invention.
Figure 5:
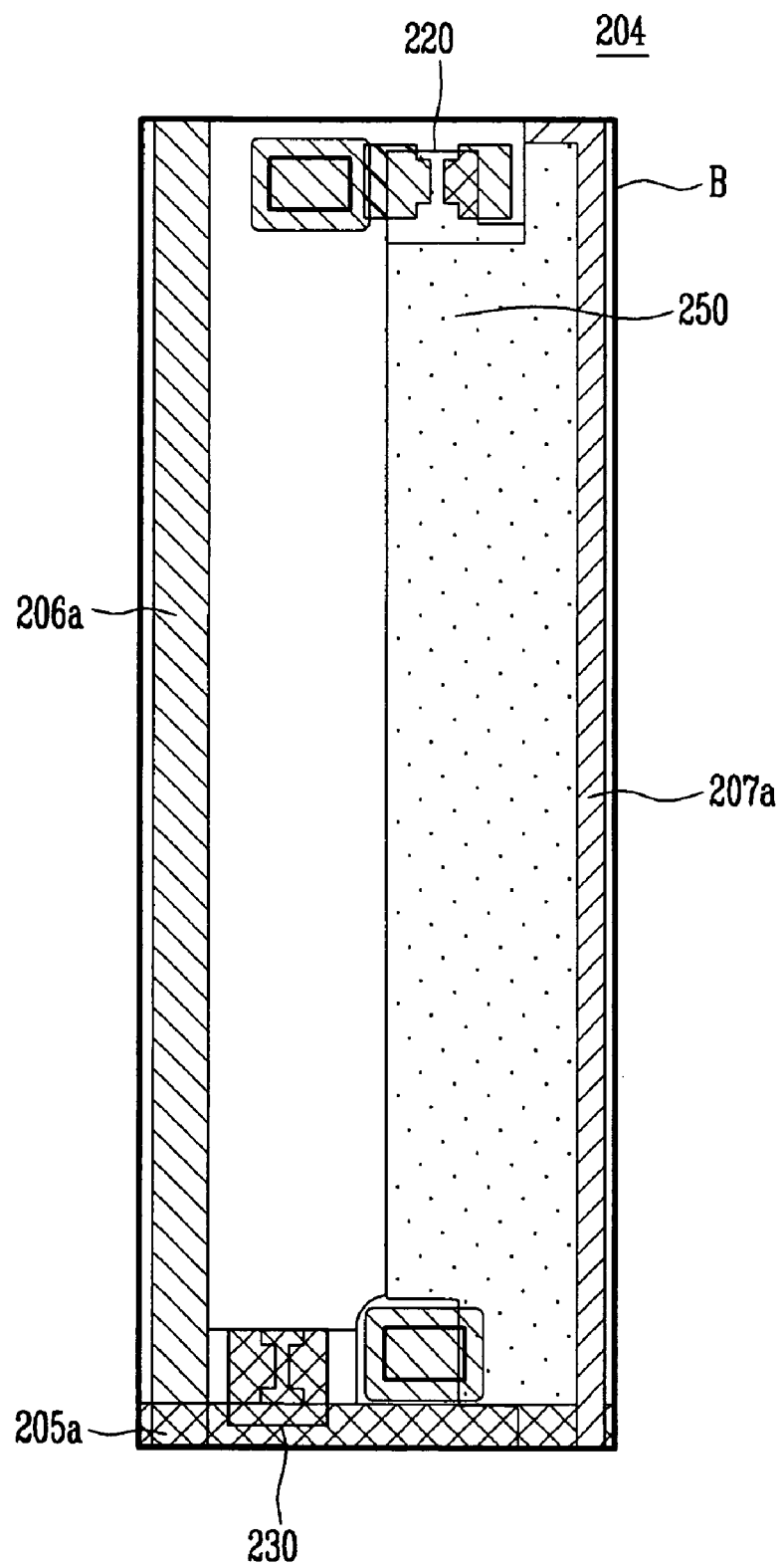
FIG. 5 is a schematic plan view showing a structure of the sub pixel of FIG. 4.

FIG. 4 is a schematic plan view of an organic light emitting display device according to another embodiment of the present invention. FIG. 5 is a schematic plan view showing a structure of the sub pixel of FIG. 4.

FIG. 4 is overall the same as the organic light emitting display device of FIG. 1, but is for more improving in transmittance as compared to the organic light emitting display device of FIG. 1, having difference in that all of electrodes and wires in the pixel unit 202 are formed of a transparent conductive material.

Also, in order to prevent voltage drop of the organic light emitting display device 20, power supply lines 207 disposed in an external region of the pixel unit 202, that is a non-pixel unit 203, are made of an opaque metal material.

Upon more specifically reviewing a sub pixel 204 provided in a pixel unit 202 through FIG. 5, all of first and second thin film transistors 220 and 230, a capacitor 250, a scan line 205a, a data line 206, and a pixel power line 207a disposed in each sub pixels 204, are formed of a transparent conductive material so that the entire region of the sub pixel 204 are transparently formed.

In other words, the entire region (B) of the sub pixel 204 is transparently formed. Also, the entire region of the sub pixel 204 is formed of a transparent conductive metal so that the pixel unit 202 formed gathering a plurality of sub pixels 204 is transparently formed.

However, the power supply line 207 disposed in the non-pixel unit 203 that is the outside of the pixel unit 202 is formed of an opaque electrode material so that voltage drop of the organic light emitting display device 20 is prevented.

In general, in the organic light emitting display device, the amount of current flowing on the power supply line 207 is indicated to be the largest. Therefore, in the present embodiment, the power supply line 207 is formed of a metal material having low resistance to prevent voltage drop of the organic light emitting display device 20.

Also, the power supply line 207 uses the same material as the opaque electrode material of FIG. 3 previously described. Also, the power supply line 207 is disposed in the non-pixel unit 203 not to obstruct the transmittance of the organic light emitting display device 20.

As described above, in the present invention, the electrodes and wires formed in the pixel unit 204 are formed of a transparent conductive material, making it possible to implement the organic light emitting display device as a transparent display.

Also, the power supply line 207 disposed in the non-pixel unit 203 is formed of the metal electrode having low resistance so that voltage drop of the sub pixel 204 is prevented. If the voltage drop of the sub pixel 204 is prevented as above, the organic light emitting display device 20 displays uniform brightness.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalent thereof.

What is claimed is:

1. An organic light emitting display device, comprising:
   a pixel unit comprising a plurality of scan lines, data lines and pixel power lines arranged in a matrix and forming respective sub pixels in an intersection region of the plurality of scan lines, data lines and pixel power lines;
   a thin film transistor comprising a pad unit receiving signals to drive the respective sub pixels, a scan driver and a data driver supplying the signals to the plurality of scan lines and data lines through the pad unit, and non-pixel unit formed with a power supply line supplying power to the pixel powers line, the sub-pixel comprising an oxide semiconductor layer;

a capacitor disposed spaced from the thin film transistor and having a lower electrode and an upper electrode formed of a transparent conductive material; and an organic light emitting element electrically coupled to the thin transistor and disposed on the capacitor.

2. The organic light emitting display as claimed in claim 1, wherein the scan lines, the data lines, the pixel power lines, and the power supply line are formed of an opaque metal material.

3. The organic light emitting display as claimed in claim 1, wherein the scan lines, the data lines, gate electrode and source/drain electrodes of the thin film transistor, and the pixel power line are formed of a transparent conductive material, and the power supply line is formed of an opaque metal material.

4. The organic light emitting display according to any one of claims 2 and 3, wherein the opaque metal material is one of the group consisting of aluminum (Al), silver (Ag), molybdenum (Mo), chrome (Cr), nickel (Ni), gold (Au), titanium (Ti), and tantalum (Ta).

5. The organic light emitting display as claimed in claim 1, wherein the transparent conductive material is at least one selected from the group consisting of indium tin oxide (ITO), indium zinc oxide (IZO), indium zinc tin oxide (IZTO), indium cesium oxide (ICO), an indium tungsten oxide (IWO), and semitransparent metal composition.

6. The organic light emitting display as claimed in claim 1, wherein the oxide semiconductor layer has zinc oxide (ZnO) as a main element.

7. The organic light emitting display as claimed in claim 6, wherein the oxide semiconductor layer is doped with at least one ion of indium (In), gallium (Ga), and stannum (Sn).

8. An organic light emitting display device, comprising:

a pixel unit having a plurality of scan lines, data lines and pixel power lines arranged in a matrix and forming respective sub pixels in an intersection region of the plurality of scan lines, data lines and pixel power lines;

a thin film transistor having a pad unit receiving signals to drive the respective sub pixels, a scan driver and a data driver supplying the signals to the plurality of scan lines and data lines through the pad unit, and non-pixel unit formed with a power supply line supplying power to the pixel powers line, the sub-pixel are an oxide semiconductor layer;

a capacitor disposed spaced from the thin film transistor and having a lower electrode and an upper electrode formed of a transparent conductive material; and an organic light emitting element electrically coupled to the thin transistor and disposed on the capacitor, wherein the power supply line is made of an opaque metal material having a low resistance.

9. The organic light emitting display as claimed in claim 8, wherein the scan lines, the data lines, the pixel power lines, and the power supply line are formed of an opaque metal material.

10. The organic light emitting display as claimed in claim 8, wherein the scan lines, the data lines, gate electrode and source/drain electrodes of the thin film transistor, and the pixel power line are formed of a transparent conductive material.

11. The organic light emitting display according to any one of claims 9 and 10, wherein the opaque metal material is one of the group consisting of aluminum (Al), silver (Ag), molybdenum (Mo), chrome (Cr), nickel (Ni), gold (Au), titanium (Ti), and tantalum (Ta).

12. The organic light emitting display as claimed in claim 8, wherein the transparent conductive material is at least one selected from the group consisting of indium tin oxide (ITO), indium zinc oxide (IZO), indium zinc tin oxide (IZTO), indium cesium oxide (ICO), an indium tungsten oxide (IWO), and semitransparent metal composition.

13. The organic light emitting display as claimed in claim 8, wherein the oxide semiconductor layer has zinc oxide (ZnO) as a main element.

14. The organic light emitting display as claimed in claim 13, wherein the oxide semiconductor layer is doped with at least one ion of indium (In), gallium (Ga), and stannum (Sn).

* * * * *